(12) United States Patent
Miyazaki

(10) Patent No.: US 10,795,196 B2
(45) Date of Patent: Oct. 6, 2020

(54) DISPLAY DEVICE

(71) Applicant: Sharp Kabushiki Kaisha, Sakai, Osaka (JP)

(72) Inventor: Shinichi Miyazaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/482,780

(22) PCT Filed: Jan. 31, 2018

(86) PCT No.: PCT/JP2018/003123
§ 371 (c)(1),
(2) Date: Aug. 1, 2019

(87) PCT Pub. No.: WO2018/143244
PCT Pub. Date: Aug. 9, 2018

(65) Prior Publication Data
US 2019/0353947 A1 Nov. 21, 2019

(30) Foreign Application Priority Data
Feb. 2, 2017 (JP) ................. 2017-017648

(51) Int. Cl.
*G02F 1/1333* (2006.01)
*G02F 1/1343* (2006.01)
(Continued)

(52) U.S. Cl.
CPC ........ *G02F 1/13338* (2013.01); *G02F 1/1343* (2013.01); *G06F 3/044* (2013.01); *G06F 3/0412* (2013.01); *H03K 17/955* (2013.01)

(58) Field of Classification Search
CPC .... G06F 3/0412; G06F 3/044; G02F 1/13338; G02F 1/1343; H03K 17/955
See application file for complete search history.

(56) References Cited

U.S. PATENT DOCUMENTS

2017/0318175 A1    11/2017   Kobayashi

FOREIGN PATENT DOCUMENTS

| JP | 2015-014932 A | 1/2015 |
| JP | 2015-138603 A | 7/2015 |

(Continued)

OTHER PUBLICATIONS

Official Communication issued in International Patent Application No. PCT/JP2018/003123, dated Apr. 24, 2018.

*Primary Examiner* — Robert J Michaud
(74) *Attorney, Agent, or Firm* — Keating & Bennett, LLP

(57) ABSTRACT

The present invention provides a display device that can correctly detect the approach of an object to be detected. A display device (10) includes conductors (40a) and (40b) arranged outside a display region (R) on a display substrate so as to extend along the outer periphery of the display region (R). The conductors (40a) and (40b) are configured such that a predetermined voltage is applied thereto and capacitances are formed between the conductors and an object to be detected. The outer periphery of the display region (R) has a corner portion (C) that is at least partially bent. The conductors (40a) and (40b) are adapted such that the capacitance formed between the conductors and the object to be detected at the corner portion (C) is adjusted so as to be approximately equal to the capacitances formed between the conductors and the object to be detected in regions other than the corner portion (C).

3 Claims, 5 Drawing Sheets

(51) Int. Cl.
    *G06F 3/041*     (2006.01)
    *G06F 3/044*     (2006.01)
    *H03K 17/955*     (2006.01)

(56)     References Cited

FOREIGN PATENT DOCUMENTS

JP     2017-200143 A     11/2017
JP     2017200143 A   *  11/2017   ......... H04N 1/00496

\* cited by examiner

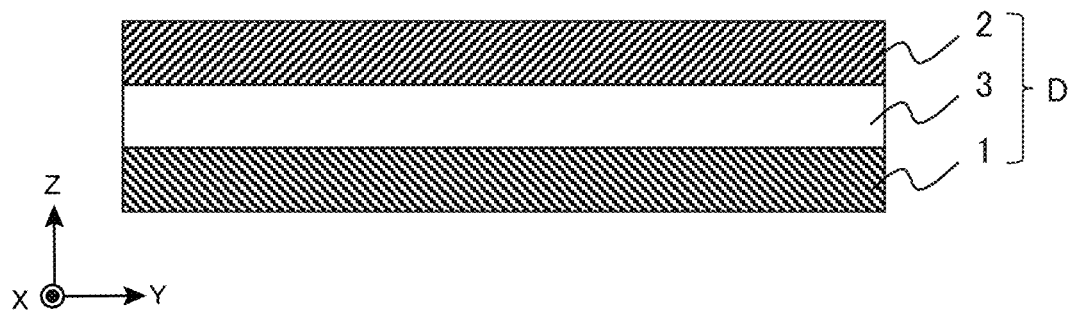
F I G. 1
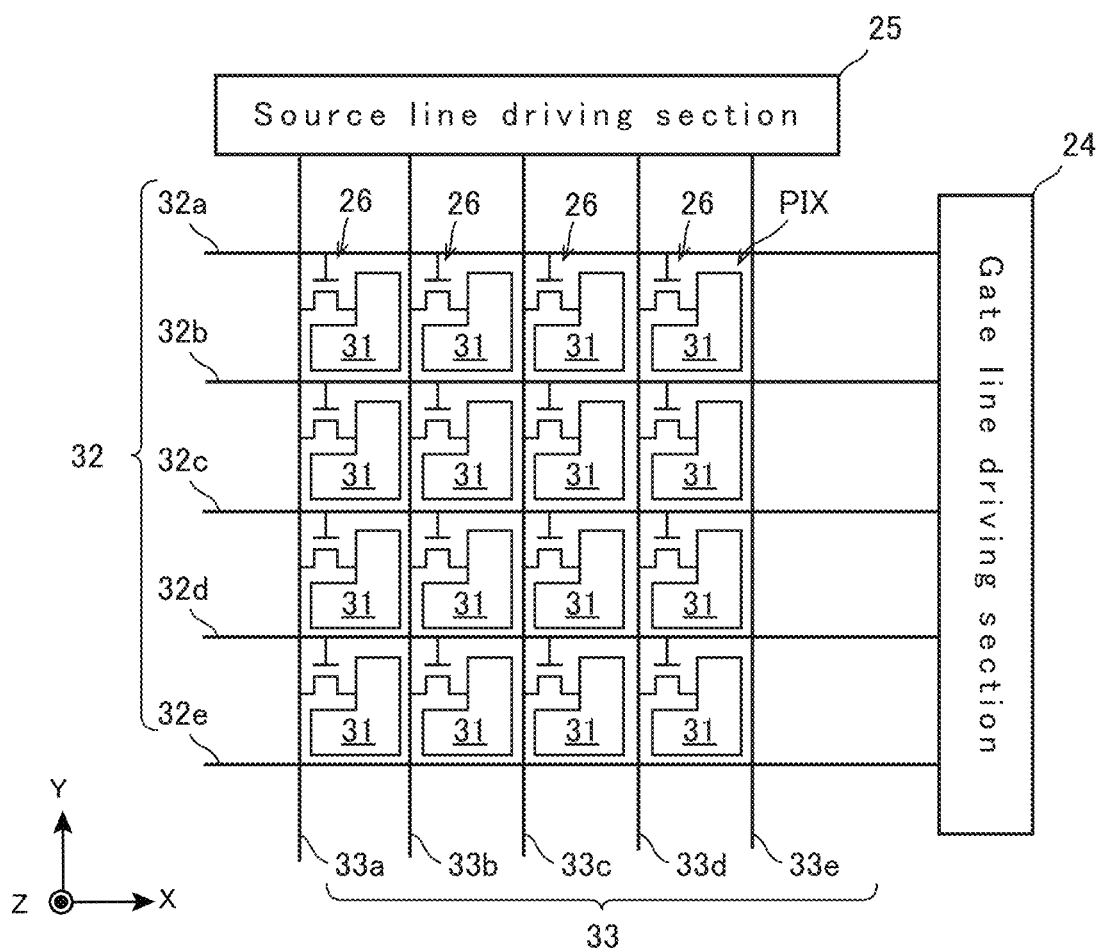
F I G. 2

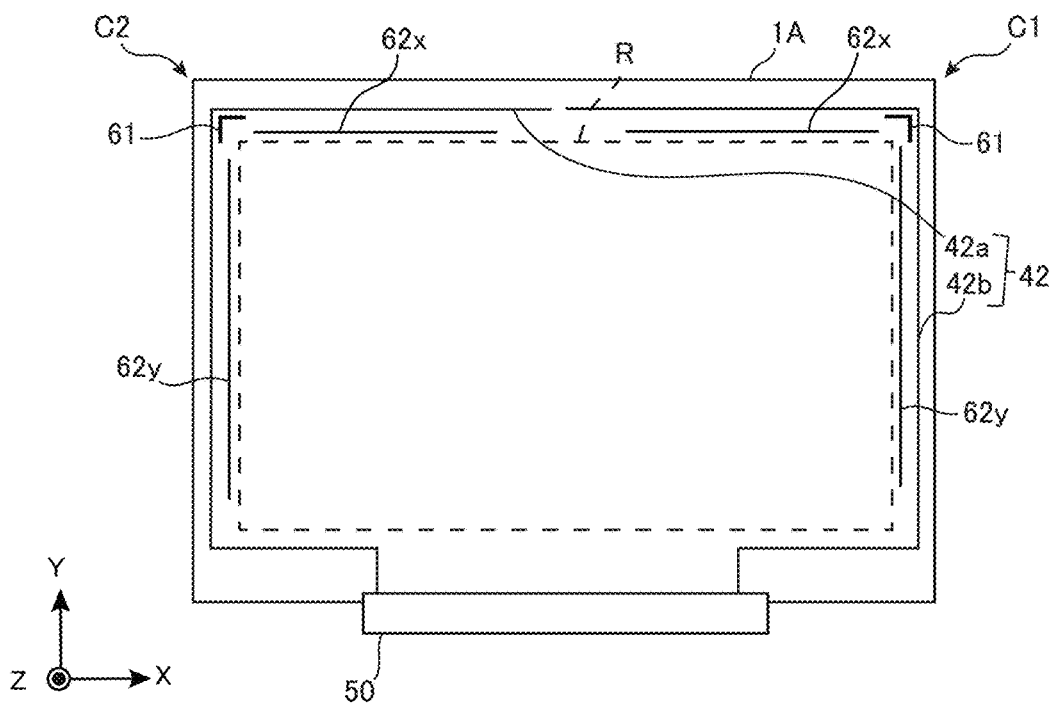
F I G. 6
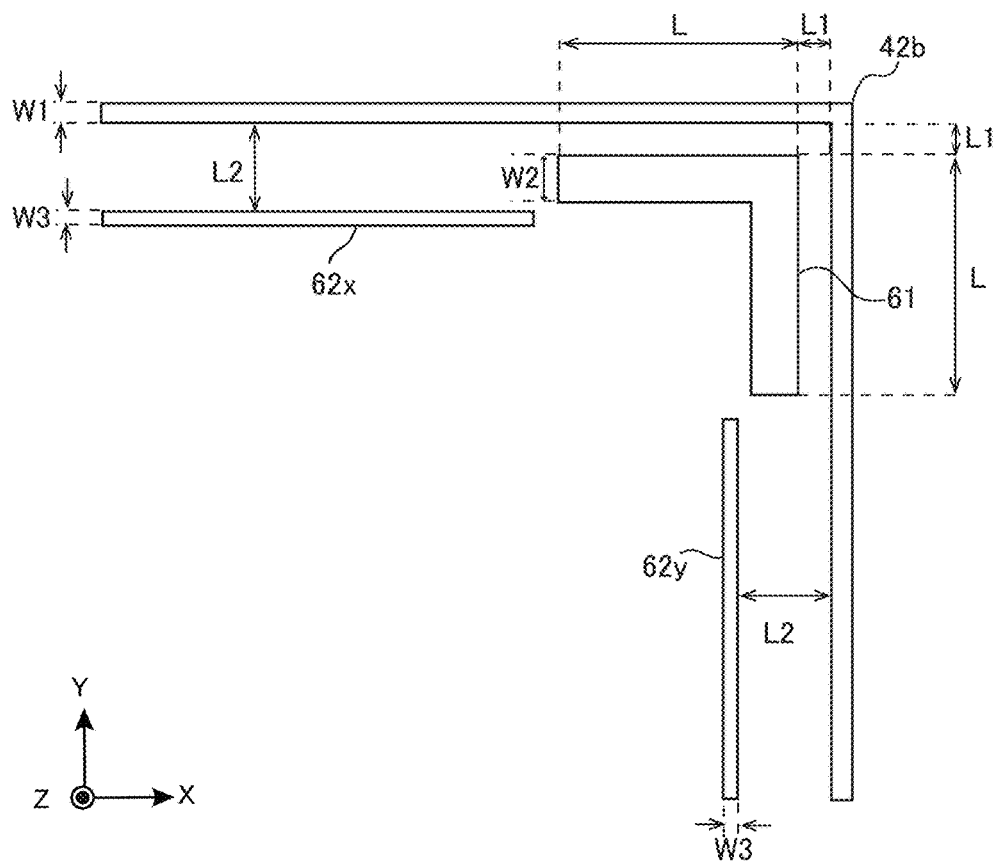
F I G. 7

DISPLAY DEVICE

TECHNICAL FIELD

The present invention relates to a display device.

BACKGROUND ART

In recent years, portable terminals, such as smartphones, provided with a proximity sensor are in widespread use. The proximity sensor provided in a portable terminal is used for various purposes. For example, in order to prevent malfunctions of a touch panel of a smartphone due to the approach of a user's face, ear, or the like to the smartphone when the user makes a phone call, the approach of an object to be detected is detected by the proximity sensor and the touch panel is controlled on the basis of the detection result (JP 2015-014932 A).

SUMMARY OF INVENTION

Various types of sensors such as infrared sensors that utilize infrared light, capacitive sensors, and inductive sensors are used as a proximity sensor. When a capacitive sensor is used as a proximity sensor, as shown in FIG. 9, a conductor 400 is arranged so as to extend around a display region r in a portable terminal to constitute the proximity sensor. In this case, the area where each of conductor portions 401 located at corner portions C capacitively couples to an object to be detected is larger than the area where each of conductor portions 402 located in straight regions other than the corner portions C capacitively couples to the object to be detected. Accordingly, the corner portions C exhibit higher detection sensitivities than the straight regions other than the corner portions C. As a result, at the corner portions C, the approach of the object to be detected may be detected even when the object is actually located farther than a predetermined distance. That is to say, the detection sensitivity varies between the corner portions C and the regions other than the corner portions C, and whether the object to be detected has approached within the predetermined distance cannot be detected correctly.

It is an object of the present invention to provide a display device that can correctly detect the approach of an object to be detected.

A display device according to one embodiment of the present invention is a display device including: a display substrate having a display region; and conductors arranged outside the display region on the display substrate so as to extend along an outer periphery of the display region, the conductors being configured such that a predetermined voltage is applied thereto and capacitances are formed between the conductors and an object to be detected, wherein the outer periphery of the display region has a corner portion that is at least partially bent, and the conductors are adapted such that the capacitance formed between the conductors and the object to be detected at the corner portion is adjusted so as to be approximately equal to the capacitances formed between the conductors and the object to be detected in regions other than the corner portion.

According to the present invention, the approach of an object to be detected can be detected correctly.

BRIEF DESCRIPTION OF DRAWINGS

FIG. 1 is a sectional view showing a schematic configuration of a display device according to a first embodiment.

FIG. 2 is a plan view showing a schematic configuration of an active matrix substrate shown in FIG. 1.

FIG. 6 is a plan view showing a schematic configuration of an active matrix substrate in a third embodiment.

FIG. 7 is a schematic view showing a conductor and ground electrodes shown in FIG. 6 in an enlarged state.

DESCRIPTION OF EMBODIMENTS

Figure 3:
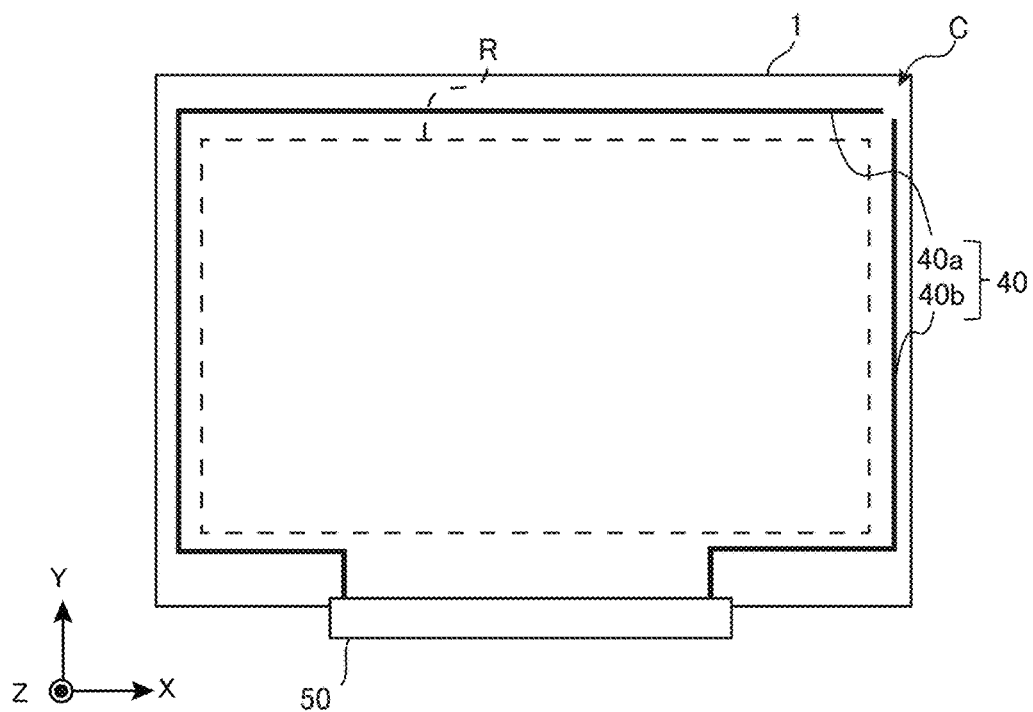
FIG. 3 is a plan view showing an example of the arrangement of a proximity sensor provided outside a display region of the active matrix substrate shown in FIG. 1.

A display device according to one embodiment of the present invention is a display device including: a display substrate having a display region; and conductors arranged outside the display region on the display substrate so as to extend along an outer periphery of the display region, the conductors being configured such that a predetermined voltage is applied thereto and capacitances are formed between the conductors and an object to be detected, wherein the outer periphery of the display region has a corner portion that is at least partially bent, and the conductors are adapted such that the capacitance formed between the conductors and the object to be detected at the corner portion is adjusted so as to be approximately equal to the capacitances formed between the conductors and the object to be detected in regions other than the corner portion (first configuration).

According to the first configuration, the display substrate includes the display region having the corner portions (C) that are at least partially bent. On the display substrate, the conductors are arranged outside the display region so as to extend along the outer periphery of the display region. The capacitances formed between the conductors and the object to be detected are adjusted such that the capacitance formed at the corner portion is approximately equal to the capacitances formed in regions other than the corner portion. With this configuration, variations in detection sensitivity of the conductors at the corner portion and in the regions other than the corner portion are reduced, whereby the approach of the object to be detected can be detected correctly.

In the first configuration, the conductors may be arranged so as to be spaced apart from each other at the corner portion (second configuration).

According to the second configuration, since the conductors are arranged so as to be spaced apart from each other at the corner portion, the area where the conductors capacitively couple to the object to be detected is small at the corner portion. As a result, variations in detection sensitivity of the conductors at the corner portion and in the regions other than the corner portion are reduced, whereby the approach of the object to be detected can be detected correctly.

In the first configuration, a width of the conductor at the corner portion may be smaller than a width of the conductor in the regions other than the corner portion (third configuration).

According to the third configuration, the area where the conductor capacitively couples to the object to be detected at the corner portion is reduced, whereby variations in detection sensitivity of the conductors at the corner portion and in the regions other than the corner portion can be reduced. As a result, it is possible to detect the approach of an object to be detected correctly.

In the first configuration, the display device may further include a plurality of ground electrodes that are arranged in the vicinity of the conductors and grounded, and out of the plurality of ground electrodes, the ground electrode arranged in the vicinity of the conductor at the corner portion may be located closer to the conductor than the other ground electrodes (fourth configuration).

According to the fourth configuration, electromagnetic coupling between the conductor at the corner portion and the ground electrode arranged in the vicinity thereof is stronger than those in other regions, whereby the capacitive coupling between the conductor and the object to be detected at the corner portion can be reduced. As a result, variations in detection sensitivity of the conductors at the corner portion and in the regions other than the corner portion are reduced, whereby the approach of the object to be detected can be detected correctly.

In the fourth configuration, the ground electrode arranged in the vicinity of the conductor at the corner portion may have a larger width than the other ground electrodes (fifth configuration).

According to the fifth configuration, the electromagnetic coupling between the conductor at the corner portion and the ground electrode arranged in the vicinity thereof can be made still stronger, whereby the capacitive coupling between the conductor and the object to be detected at the corner portion can be further reduced.

In any of the third to fifth configurations, the display substrate may have a rectangular shape and may include, on one edge of the display substrate, a terminal that supplies the predetermined voltage to the conductors, and the conductors may be spaced apart from each other at a portion along an edge of the display substrate opposite to the one edge (sixth configuration).

According to the sixth configuration, the load on the conductors can be reduced as compared with the case where the conductors are arranged so as to extend continuously.

Embodiments of the present invention will be described below with reference to the drawings. Components/portions that are identical or equivalent to each other in the drawings are given the same reference numerals, and descriptions thereof are not repeated. For clarity of illustration, in the drawings to be referred to in the following description, structures may be shown in simplified or schematic forms, and some components may be omitted. The dimensional ratios between components shown in the respective drawings do not necessarily represent actual dimensional ratios.

First Embodiment

FIG. 1 is a sectional view showing a schematic configuration of a display device according to the present embodiment. A display device 10 of the present embodiment includes a display substrate D, which includes an active matrix substrate 1, a counter substrate 2, and a liquid crystal layer 3 interposed between the active matrix substrate 1 and the counter substrate 2. In the present embodiment, the display substrate D is rectangular. Although not shown in FIG. 1, the display device 10 includes a backlight provided on the side opposite to the liquid crystal layer 3 side of the active matrix substrate 1.

The display device 10 has a function of displaying an image and also a function of detecting a position touched by a user on the displayed image (touched position). This display device 10 is a display device equipped with a so-called in-cell type touch panel, in which elements necessary for detecting a touched position are provided on the active matrix substrate 1.

FIG. 2 is a plan view showing a schematic configuration of the active matrix substrate 1 shown in FIG. 1. As shown in FIG. 2, on the active matrix substrate 1, a plurality of gate lines 32 and a plurality of source lines 33 that cross the plurality of gate lines 32 are provided. Pixels PIX, which are constituted by the gate lines 32 and the sources lines 33, are each provided with a switching element 26 connected to the gate line 32 and to the source line 33 and a pixel electrode 31 connected to the switching element 26. The switching element 26 is a thin film transistor (TFT), for example.

On the counter substrate 2 (see FIG. 1), color filters (not shown) of three colors, namely, red (R), green (G), and blue (B), are provided so as to correspond to the respective pixel electrodes 31. With this configuration, each of the pixel electrodes 31 functions as a subpixel of any one color out of R, G, and B.

The plurality of gate lines 32 are connected to a gate line driving section 24 provided outside a display region of the active matrix substrate 1. The gate line driving section 24 applies gate line driving signals for switching the plurality of gate lines $32a$, $32b$, $32c$, ... to the selected state sequentially one by one for every single horizontal scanning period.

The plurality of source lines 33 are connected to a source line driving section 25 provided outside the display region of the active matrix substrate 1. In an image display period, the source line driving section 25 supplies data signals corresponding to the gradations of an image to be displayed to the source lines 26.

In the display device 10, liquid crystal molecules contained in the liquid crystal layer 3 are driven in an in-plane switching mode, for example. In order to achieve the in-plane switching mode, the pixel electrodes 31 and counter electrodes (also called "common electrodes"), which are both involved in electric field formation, are formed on the active matrix substrate 1.

Although not shown in FIG. 1, the counter electrodes are formed on a surface of the active matrix substrate 1, which the surface is on the liquid crystal layer 3. Each counter electrode is in a rectangular shape that is approximately square with each side thereof being about 4 mm, for example, and the plurality of counter electrodes are arranged in matrix. The counter electrodes each have a slit (e.g., several micrometers in width) for generating in-plane electric field between the counter electrodes and the pixel electrodes 31.

On the active matrix substrate 1, a controller connected to the counter electrodes is provided outside the display region. The controller performs a control for displaying an image, and also performs a control for detecting a touched position.

The display device 10 performs operations as a touch panel and operations as a display in a time-division system. During the operations as the touch panel, each of the counter electrodes is driven as an independent sensor. During the operations as the display, the counter electrodes is driven with the pixel electrodes to be described below to display images.

As shown in FIG. 3, the active matrix substrate 1 has the rectangular display region R constituted by the above-described pixels PIX. On the active matrix substrate 1, a proximity sensor 40 is provided outside the display region R.

The proximity sensor 40 is constituted by conductors 40a and 40b. The conductors 40a and 40b are arranged such that they surround the display region R and are spaced apart from each other at one corner portion C of the display region R.

A terminal 50 is provided on one edge of the active matrix substrate 1. The conductors 40a and 40b are connected to the terminal 50. To the terminal 50, a control circuit (not shown) provided outside the active matrix substrate 1 and configured to apply a predetermined voltage to the proximity sensor 40 is to be connected.

The proximity sensor 40 is a self-capacitance sensor configured such that a predetermined voltage is applied thereto from the control circuit (not shown) and a capacitance is formed between the proximity sensor 40 and a dielectric object to be detected. The control circuit detects whether the object to be detected has approached within a certain distance on the basis of the change in capacitance in the proximity sensor 40.

By arranging the conductors 40a and 40b such that they are spaced apart from each other at one corner portion C of the active matrix substrate 1, the area where the proximity sensor 40 capacitively couples to an object to be detected at the corner portion C is made smaller as compared with the case where a conductor that extends continuously is provided at the corner portion C, and accordingly, the capacitance formed between the proximity sensor 40 and the object to be detected at the corner portion C is made smaller. That is, the difference between the capacitance formed between the proximity sensor 40 and the object to be detected at the corner portion C and the capacitance formed between each straight portion of the proximity sensor 40 and the object to be detected is made smaller, whereby the capacitance formed with the object to be detected at the corner portion C becomes closer to being equal to the capacitances formed with the object to be detected in regions other than the corner portion C. As a result, variations in detection sensitivity in the proximity sensor 40 for the object to be detected are reduced, and the approach of the object to be detected can be detected correctly.

In this example, the corner portion C is the upper right corner portion of the rectangular display region R shown in FIG. 3. At three corner portions other than the corner portion C, the conductor 40a or 40b is provided so as to extend continuously. Accordingly, detection sensitivities at these three corner portions are higher than those in the straight portions. However, by reducing the detection sensitivity at least at one corner portion C, it is possible to reduce the variations in detection sensitivity as the proximity sensor 40.

Second Embodiment

The above-described first embodiment describes an example where the proximity sensor 40 is arranged outside the display region R such that the conductors constituting the proximity sensor 40 are spaced apart from each other at one corner portion C, whereby the difference in detection sensitivity between the corner portion C and each of the straight regions other than the corner portion C is reduced. The present embodiment describes an example where, in order to make the detection sensitivity at the corner portion C approximately equal to the detection sensitivities in straight regions other than the corner portion C, the capacitance formed by the proximity sensor at the corner portion is adjusted using a method different from that in the first embodiment.

Figure 4:
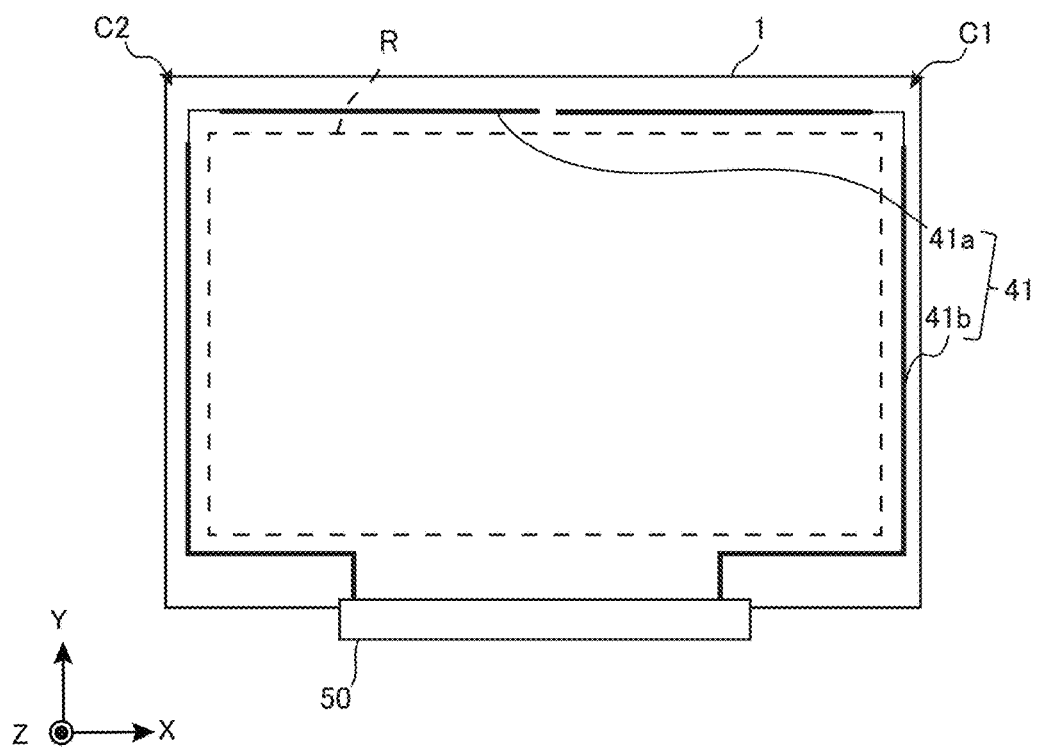
FIG. 4 is a plan view showing an example of the arrangement of a proximity sensor in a second embodiment.

FIG. 4 is a plan view showing an example of the arrangement of a proximity sensor in the second embodiment. In FIG. 4, a proximity sensor 41 is constituted by conductors 41a and 41b. The conductors 41a and 41b are arranged outside a display region R of an active matrix substrate 1 such that they surround the display region R and are spaced apart from each other substantially at the center of an edge opposite to the edge of the active matrix substrate 1 on which a terminal 50 is provided. By constituting the proximity sensor 41 using the two conductors as described above, the load on the proximity sensor can be reduced as compared with the case where the proximity sensor is constituted using one conductor.

A portion of the conductor 41a provided at the corner portion C1 and a portion of the conductor 41b provided at a corner portion C2 each have a smaller line width than other portions. Since the conductors 41a and 41b have the same configuration, specific configurations of the conductors 41a and 41b will be described below taking the conductor 41b as an example.

Figure 5:
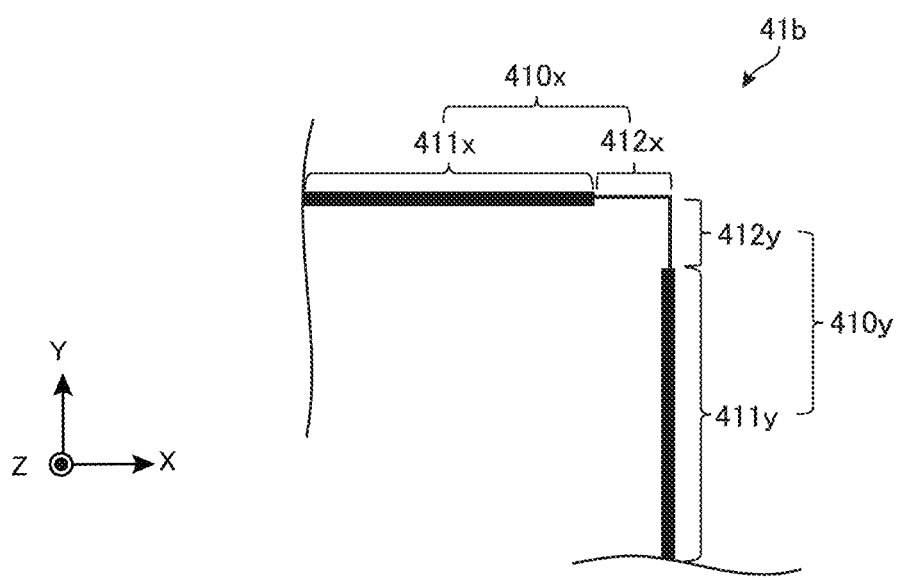
FIG. 5 is a schematic view showing a part of a conductor shown in FIG. 4 in an enlarged state.

FIG. 5 is a schematic view showing a part of the conductor 41b in an enlarged state. As shown in FIG. 5, the conductor 41b has a conductor portion 410x parallel to the x-axis and a conductor portion 410y parallel to the y-axis. The conductor portion 410x is constituted by a conductor portion 411x provided in a region other than the corner portion C2 and a conductor portion 412x provided at the corner portion C2. The conductor portion 410y is constituted by a conductor portion 411y provided in a region other than the corner portion C2 and a conductor portion 412y provided at the corner portion C2. The conductor portions 411x and 411y have the same line width, and the conductor portions 412x and 412y have the same line width.

The size of the corner portion C2, i.e., the lengths of the conductor portions 412x and 412y are L mm in the case where, for example, the width of a detection target is L mm. The line widths of the conductor portions 412x and 412y are adjusted such that, with the line widths of the conductor portions 411x and 411y being reference line widths, the area of the conductor portions 412x and 412y is about 50% of the area of the conductor portions 412x and 412y when they have the reference line widths. That is, the line widths of the conductor portions 412x and 412y are about ½ of those of the conductor portions 411x and 411y, and the area where the conductor portions 412x and 412y provided at the corner portion C2 capacitively couple to a detection target is approximately equal to the area where the conductor portion 411x or 411y capacitively couples to the detection target. As a result, variations in detection sensitivity in the proximity sensor 41 are reduced as compared to the case where the conductor 41b has a uniform line width, and the approach of an object to be detected can be detected correctly.

Third Embodiment

The above-described second embodiment describes an example where the proximity sensor 41 provided outside the display region R is configured such that the portions thereof arranged at the two corner portions of the display region R have smaller line widths than the other portions, whereby the difference in detection sensitivity of the proximity sensor 41 between the corner portions and the straight portions is reduced. The present embodiment describes an example where variations in detection sensitivity in a proximity sensor are reduced without changing the line width of the proximity sensor.

FIG. 6 is a plan view showing a schematic configuration of an active matrix substrate 1A in the present embodiment. As shown in FIG. 6, a proximity sensor 42 constituted by conductors 42*a* and 42*b* is provided outside a display region R of the active matrix substrate 1A so as to surround the display region R. The conductors 42*a* and 42*b* are spaced apart from each other substantially at the center of an edge opposite to one edge of the active matrix substrate 1A on which a terminal 50 is provided. The conductors 42*a* and 42*b* have the same line width.

Outside the display region R of the active matrix substrate 1A, a plurality of ground electrodes 61, 62*x*, and 62*y* that have been grounded are further provided. The ground electrodes 61 are provided at corner portions C1 and C2. The ground electrodes 62*x* are provided so as to extend substantially parallel to portions that are parallel to the x-axis in the conductors 42*a* and 42*b*. The ground electrodes 62*y* are provided so as to extend substantially parallel to portions that are parallel to the y-axis in the conductors 42*a* and 42*b*. The ground electrodes 61 and also the ground electrodes 62*x* and 62*y* will be described specifically below.

FIG. 7 is an enlarged schematic view showing the conductor 42*b* shown in FIG. 6 and the ground electrodes 61, 62*x*, and 62*y* arranged in the vicinity of the conductor 42*b*. Although FIG. 7 illustrates the present embodiment taking the ground electrodes 61, 62*x*, and 62*y* arranged in the vicinity of the conductor 42*b* as an example, the ground electrodes 61, 62*x*, and 62*y* arranged in the vicinity of the conductor 42*a* also have the same configurations.

In the example shown in FIG. 7, the distance L1 between the ground electrode 61 and the conductor 42*b* is about 150 μm, and the distance L2 between each of the ground electrodes 62*x* and 62*y* and the conductor 42*b* is about 480 μm. That is, the distance L1 between the ground electrode 61 and the conductor 42*b* and the distance L2 between each of the ground electrodes 62*x* and 62*y* and the conductor 42*b* satisfy the relationship L1<L2, and the ground electrode 61 is located closer to the conductor 42*b* than the ground electrodes 62*x* and 62*y*.

In this example, the conductor 42*b* has a line width W1 of about 210 μm, whereas the ground electrode 61 has an electrode width W2 of about 490 μm and the ground electrodes 62*x* and 62*y* each have an electrode width W3 of about 60 μm. That is, the line width W1 of the conductor 42*b*, the electrode width W2 of the ground electrode 62*x*, and the electrode width W3 of the ground electrode 62*y* satisfy the relationship W2>W1>W3. When the width of a detection target is L mm, the range in which the ground electrode 61 extends in the x-axis direction and the y-axis direction is L mm.

With such a configuration, electromagnetic coupling between a portion of the conductor 42*b* provided at the corner portion C1 (see FIG. 6) and the ground electrode 61 is stronger than those between portions of the conductor 42*b* provided in straight regions other than the corner portion C1 and the respective ground electrodes 62*x* and 62*y*. As a result, the detection sensitivity in the portion of the conductor 42*b* provided at the corner portion C1 is reduced, whereby variations in detection sensitivity in the proximity sensor 42 are reduced. Accordingly, the approach of an object to be detected can be detected correctly at the corner portion C1.

Although the display device according to the exemplary embodiment of the present invention has been described above, the configuration of the display device according to the present invention is not limited to configurations in the above-described embodiments and may be modified in various ways.

(1) In the above third embodiment, at least one of the distance between each of the ground electrodes 61, 62*x*, and 62*y* and the proximity sensor 42 and the electrode width of each of the ground electrodes 61, 62*x*, and 62*y* may be adjusted. With this configuration, it is still possible to reduce the detection sensitivities at the corner portions.

(2) Although the above first to third embodiments each describe the case where the display region is rectangular, the shape of the display region is not limited thereto. The display region may be, for example, a polygonal shape such as a triangular shape or a pentagonal shape or may be a non-rectangular shape with a part thereof being in an arc shape. In short, the shape of the display region is not limited as long as it has a corner portion that is at least partially bent.

(3) The above first embodiment describes an example where the conductors 40*a* and 40*b* are spaced apart from each other at the upper right corner portion C of the rectangular display region R. However, in order to reduce the detection sensitivities at the remaining three corner portions, a proximity sensor may be configured as shown in FIG. 8.

Figure 8:
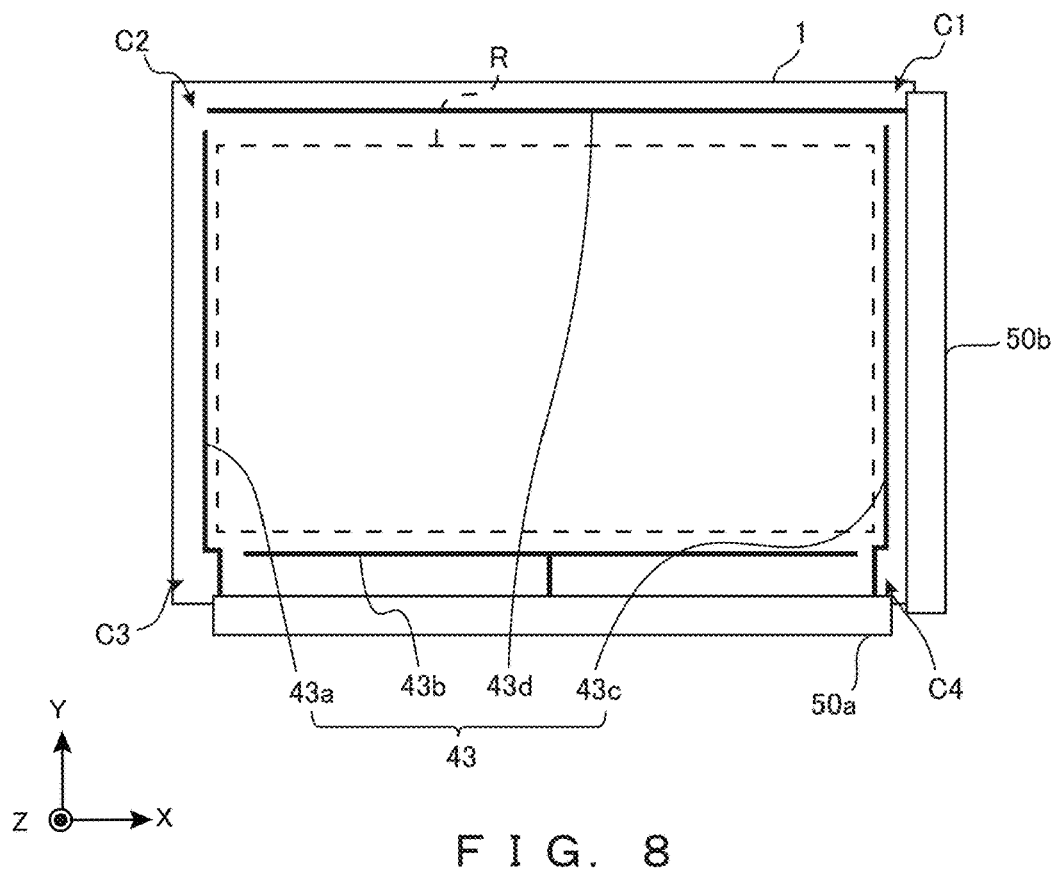
FIG. 8 is a plan view showing a schematic configuration of an active matrix substrate in a modified example (3).
Figure 9:
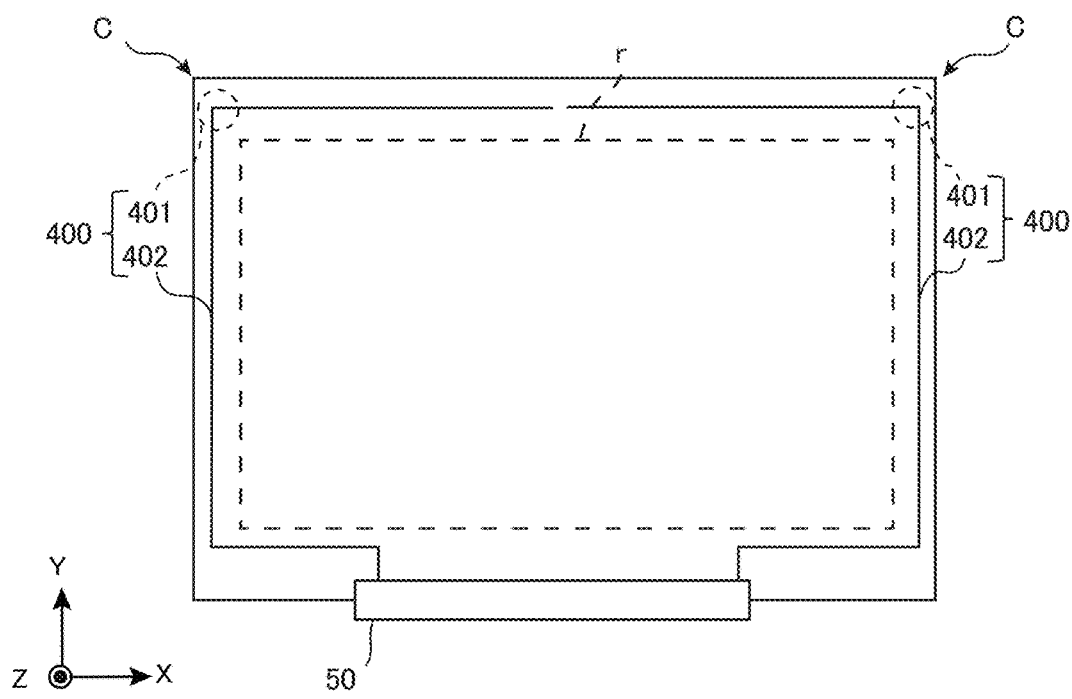
FIG. 9 is a plan view showing an example of the arrangement of a conventional proximity sensor.

In FIG. 8, on an active matrix substrate 1, a proximity sensor 43 constituted by conductors 43*a* to 43*d* and terminals 50*a* and 50*b* are provided.

The conductors 43*a* to 43*d* are arranged such that they are spaced apart from each other in the vicinity of four corner portions C1 to C4 of a display region R. The terminal 50*a* is provided on one long-edge side of the display region R and is connected to one end of each of the conductors 43*a* to 43*c*. The terminal 50*b* is provided on one short-edge side of the display region R and is connected to one end of the conductor 43*d*.

By arranging the conductors such that they are spaced apart from each other at the four corner portions C1 to C4, the detection sensitivities at the corner portions C1 to C4 are reduced as compared with the case where a conductor that extends continuously is provided at the corner portions C1 to C4, whereby variations in detection sensitivity as the proximity sensor 43 can be reduced.

The invention claimed is:

1. A display device comprising:
  a display substrate having a display region; and
  conductors arranged outside the display region on the display substrate so as to extend along an outer periphery of the display region, the conductors being configured such that a predetermined voltage is applied thereto and capacitances are formed between the conductors and an object to be detected,
  a plurality of ground electrodes that are arranged in the vicinity of the conductors and grounded, wherein
  the outer periphery of the display region has a corner portion that is at least partially bent,
  the conductors are adapted such that the capacitance formed between the conductors and the object to be detected at the corner portion is adjusted so as to be approximately equal to the capacitances formed between the conductors and the object to be detected in regions other than the corner portion, and
  out of the plurality of ground electrodes, the ground electrode arranged in the vicinity of the conductor at the corner portion is located closer to the conductor than the other ground electrodes.

2. The display device according to claim 1,
  wherein the ground electrode arranged in the vicinity of the conductor at the corner portion has a larger width than the other ground electrodes.

3. The display device according to claim 1,
wherein the display substrate has a rectangular shape and includes, on one edge of the display substrate, a terminal that supplies the predetermined voltage to the conductors, and
the conductors are spaced apart from each other at a portion along an edge of the display substrate opposite to the one edge.

* * * * *